United States Patent [19]

Hartoog

[11] Patent Number: 5,367,469
[45] Date of Patent: Nov. 22, 1994

[54] PREDICTIVE CAPACITANCE LAYOUT METHOD FOR INTEGRATED CIRCUITS

[75] Inventor: Mark R. Hartoog, Los Gatos, Calif.

[73] Assignee: VLSI Technology, Inc., San Jose, Calif.

[21] Appl. No.: 627,085

[22] Filed: Dec. 13, 1990

[51] Int. Cl.$^5$ .............................................. G06F 15/60
[52] U.S. Cl. ................................... 364/491; 364/490; 364/489; 364/488
[58] Field of Search ................. 364/488, 489, 490, 491

[56] References Cited

U.S. PATENT DOCUMENTS

| | | | |
|---|---|---|---|
| 4,694,403 | 9/1987 | Nomura | 364/488 |
| 4,823,278 | 4/1989 | Kikuchi et al. | 364/490 |
| 4,924,430 | 5/1990 | Zasio et al. | 364/488 |
| 4,947,365 | 8/1990 | Masubuchi | 364/489 |
| 4,967,367 | 10/1990 | Piednoir | 364/489 |
| 5,077,676 | 12/1991 | Johnson et al. | 364/489 |
| 5,095,454 | 3/1992 | Huang | 364/488 |

OTHER PUBLICATIONS

"Analytical Power/Timing Optimization Technique for Digital System" by Ruehli et al., IEEE 14th Design Automation Conf., 1977, pp. 142-146.

"Circuit Placement for Predictable Performance" by Hauge et al., IEEE International Conf. on Computer Aided Design, ICCAD-87, pp. 88-91, 1987.

Primary Examiner—Vincent N. Trans
Attorney, Agent, or Firm—Burns, Doane, Swecker & Mathis

[57] ABSTRACT

A method for designing a circuit layout which includes the steps of supplying a predictive capacitance value for at least one net of a circuit layout, and placing and routing all nets of the circuit layout using at least one predictive capacitance value as a layout design constraint.

15 Claims, 3 Drawing Sheets

PREDICTIVE CAPACITANCE LAYOUT METHOD FOR INTEGRATED CIRCUITS

BACKGROUND OF THE INVENTION

1. Field of the Invention

The present invention generally relates to methods for laying out integrated circuits.

2. State of the Art

It is well known to use computerized systems for laying out integrated circuits such as application-specific integrated circuits that include a number of functional blocks or "cells." A standard cell within an application-specific integrated circuit may comprise, for example, one or more random access memories (RAMs), read-only memories (ROMs), or arithmetic logic units. During the design of integrated circuits, it is usually necessary to determine the signal delays. Although signal delays can be determined by testing prototype of integrated circuits, prototypes are usually expensive. Accordingly, it is desirable to develop techniques for calculating signal delays prior to laying out integrated circuits.

In practice, however, it is difficult to calculate signal delays in integrated circuits. In part, the difficulties arise because the computational techniques, to be of practical and convenient, must be capable of computing all interconnect delays in integrated circuits having, for example, one-hundred thousand transistors by using a desktop work station over a time period less than about one hour.

In integrated circuits, signal delays can arise from various sources, including the resistance and capacitance of wires that connect elements within the circuits. Also, delays through gates in integrated circuits depend upon the loads driven by the gates drive and upon the quantity of interconnecting logic. Signal delays increase as integrated circuits become denser (i.e., contain increased numbers of elements).

Computer-based simulations are often used for estimating signal delays in integrated circuits during design. In one common simulation method, a computer program solves systems of nonlinear differential equations that are derived from the state equations which describe an integrated circuit. Such simulation programs require substantial computational time and data storage and, therefore, are impractical for routine analysis of most integrated circuits of the LSI and VLSI class.

A technique called "macro-modelling" has also been used by circuit designers for simulating LSI and VLSI integrated circuits. According to this technique, macrocells of an integrated circuit design are modelled as a small number of "standard" blocks, each of whose electrical characteristics are pre-characterized by, for example, circuit simulation. A block in a macro-modelled circuit might be, for example, a NAND gate. In this example, the pre-characterization of the block might provide a simple rule for calculating the delay at the block output as a function of the driven capacitance and of the signals arriving at input pins of the block. Using the pre-characterization rule, a system such as a logic simulator or timing verifier can predict the delay through the block.

In current practice, most logic simulators employ macro-modelling to compute delays through integrated circuits as functions of total capacitive load. These logic simulators typically perform their functions without explicitly accounting for the resistance of interconnecting paths in the simulated circuits.

Because the length of interconnecting paths in an integrated circuit normally are not known until after a physical design of the circuit has been completed, standard design practice is to use "predictive" capacitance to approximate timing delays caused by interconnecting wires in the circuit nets. (In this context, the term "nets" refers to sets of two or more circuit nodes, such as the inputs or outputs of a gate, which are joined by an interconnection.) The term "fanout one net" refers to a circuit layout net wherein a single output node of a circuit net directly drives only one other circuit net.

One problem with using conventional techniques using predictive capacitance for estimating interconnect timing delays in integrated circuits is that, after placing and routing an integrated circuit, some nets in the circuit may have capacitances substantially larger than the predicted values. In fact, the actual capacitances may exceed the predicted values even if the majority of the nets in a circuit have capacitances that are substantially smaller than their predicted values. In such cases, the majority of nets in the circuit may run faster than expected while some of the nets run much slower. Such operating speed differentials can cause timing problems which, in turn, require either manual rerouting or redesign of a circuit.

To avoid the above-discussed drawbacks, "timing-driven layout" techniques can be used. In such techniques, timing constraints are employed while placing and routing an integrated circuit. This usually involves determining timing requirements between input and output signals, and using a timing analysis tool to convert the timing requirements into layout constraints. The layout constraints can be revised as more information becomes available concerning the layout appearance. Timing-driven layout techniques are described by Michael Burnstein and Mary N. Youssef in an article entitled "Timing Influenced Layout Design" IEEE Paper 9.2, 22nd Design Automation Conference, 1982, pages 124–130.

Timing driven layout techniques cannot, however, simultaneously satisfy a large number of critical paths in an integrated circuit. Because of this limitation, circuit designers cannot specify all critical paths in large circuits without causing the timing analysis tools (which specify maximum lengths for nets) to be too slow for practical use. Consequently, timing driven layout techniques have not achieved widespread use.

SUMMARY OF THE INVENTION

Generally speaking, the present invention provides a technique for designing circuit layouts to achieve specified maximum delay times through the circuits. More particularly, the present invention provides a method for designing circuit layouts comprising the steps of: supplying a predictive capacitance value for at least one net of a circuit layout, and placing and routing all nets of the circuit layout using the at least one predictive capacitance value as a layout design constraint. Because the predictive capacitance value corresponds closely with actual interconnection capacitances, the method of the present invention significantly reduces the need for manual intervention while layout circuits.

As will be described in greater detail in the following, predictive interconnect capacitance is statistically determined for different types of integrated circuit elements such as, for example, gate array circuits and cell-based circuits. The components that compose a given circuit layout usually can be classified according to their fanout nets. Then, different predictive interconnect capacitances would be statistically determined for fanout one nets, fanout two nets, fanout three nets, and so forth. For example, predictive interconnect capacitance values for each type of circuit layout net could be determined using a histogram comprised of previously placed and routed circuit designs of similar size.

BRIEF DESCRIPTION OF THE DRAWINGS

The present invention can be further understood with reference to the following description in conjunction with the appended drawings. In the drawings:

FIGS. 3a-d are a flowchart of the method for laying out circuits in accordance with the present invention.

DETAILED DESCRIPTION OF THE PREFERRED EMBODIMENTS

Figure 1:
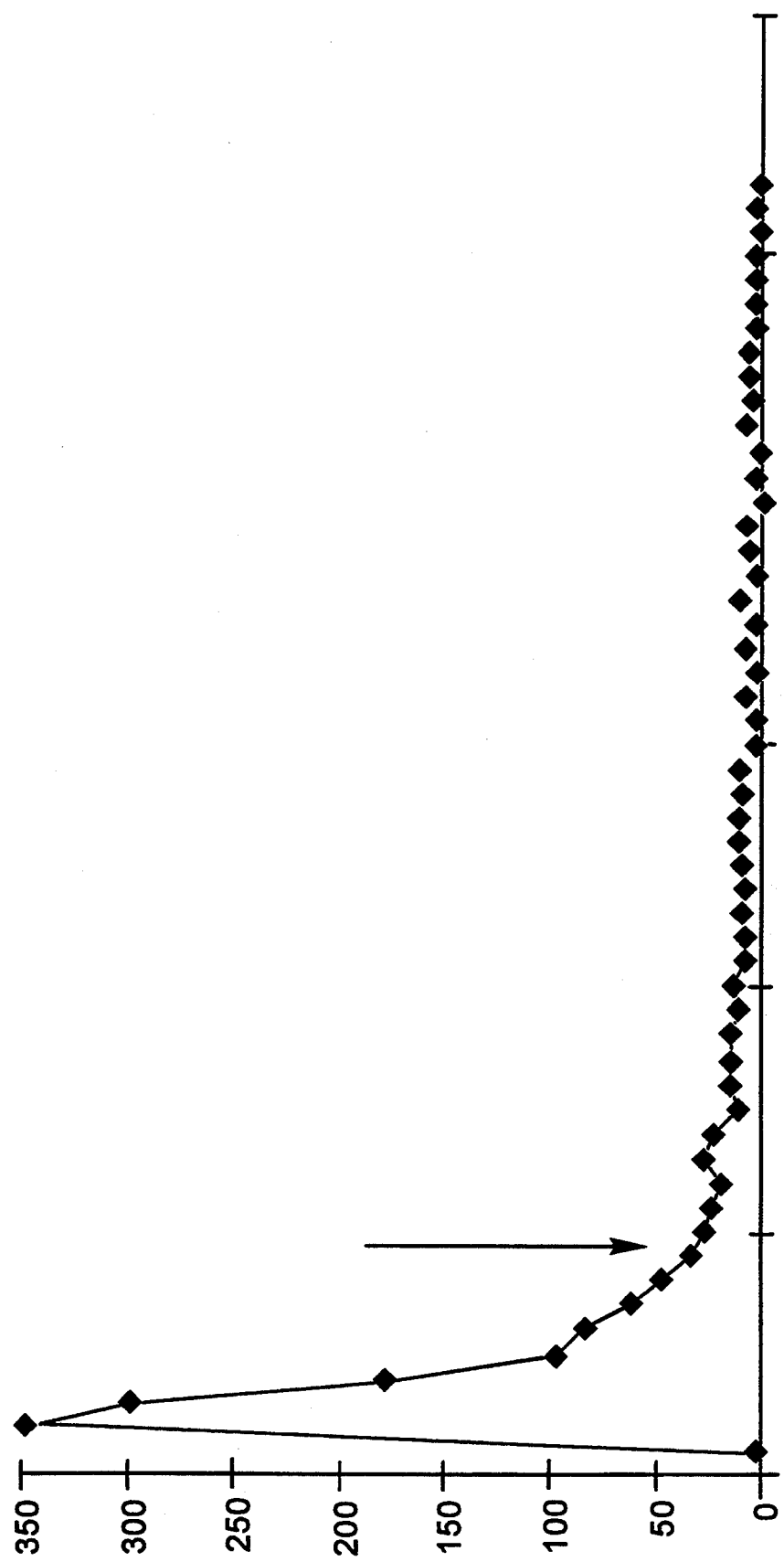
FIG. 1 is a histogram of interconnect capacitances of fanout one nets for a given circuit; and, FIGS. 2A and 2B show a comparison between the initial capacitance distribution of a circuit and the capacitance distribution that results from using a predictive capacitance driven layout technique in accordance with the method of the present invention.

FIG. 1 shows an example of an interconnect capacitance histogram for a fanout one net of an integrated circuit. Using such a net as an example, the predictive capacitance could be chosen as the value along the abscissa of the histogram of FIG. 1 indicated by the arrow. This value would define a range wherein a given percentage of the fanout one nets are expected to fall, and could be used to predict the capacitance of all fanout one nets prior to routing.

To determine the predictive capacitance C, a formula such as the following can be used:

$$C = c_1 + c_2 * FANOUT$$

In the foregoing formula, $c_1$ and $c_2$ are constants. These constants normally are determined from statistics compiled from previous designs. The value of the variable FANOUT in the equation represents the number of inputs to other cells that are driven by a given output.

The value of the predictive capacitance, C, chosen for any given histogram depends upon the desired performance accuracy of circuit layouts. Preferably, the predictive capacitance value is chosen to define a range including eighty percent of the nets in the histogram. In terms of FIG. 1, eighty percent of the nets in the histogram would fall between a range of zero and the selected predictive capacitance value, while a few nets have values as large as four or five times the predictive value.

A preferred embodiment of the present method for utilizing predictive capacitance to lay out a circuit design will now be described with reference to FIGS. 3a through 3d. Referring now to FIG. 3a, at block 300 a predictive capacitance value is supplied for at least one net of a circuit layout.

Although a predictive capacitance value itself can be used for circuit layout design, such a value (or values) is usually converted to a form that can be directly used by a place-and-route system. For example, the predictive capacitance determined from the histogram of FIG. 1 can be converted to a wire length value. Thus, in FIG. 3b, blocks 400-420, using previously placed and routed circuit designs, a value of an average capacitance per unit wire length can be computed for the circuit layout under consideration. Then, the predictive capacitance for each type of circuit net is converted into a maximum wire length value by dividing each predictive capacitance value by the average capacitance per unit wire length.

Having determined a predictive capacitance value (or maximum wire length value) for each circuit layout net, a circuit layout place-and-route system can begin to place and route cells. The place-and-route system, shown in FIG. 3a block 310, can be, for example, the one described in the article "Timing Influenced Layout Design," except that the system will be driven by the predictive capacitance supplied to the system.

The place-and-route system will now be described in more detail with reference to FIG. 3c. After placing and routing at least one cell (block 500), the place-and-route system is used for estimating wire length and capacitance for each net in the partially completed circuit layout (block 510). (If wire length is used as the predicted parameter, an estimated capacitance due to wire length need not be determined). Then, at block 520, the place-and-route system compares the estimated capacitance (or wire length) of each net with the predictive capacitance or (maximum wire length) for that net.

As shown in block 530, the results of the above-described comparison can substantially reduce the number of nets whose estimated capacitance (or wire length) exceeds the statistically determined value. Preferably, such reduction shown in FIG. 3d, is achieved by assigning weights to the nets such that larger weights are assigned to nets whose estimated capacitance exceeds their statistically determined predictive capacitance (block 600), while lower weights are assigned to nets whose estimated capacitance is less than their statistically determined predictive capacitance (block 610). For example, the weights assigned to each net can be proportional to the magnitude of the difference between the estimated capacitance and the statistically determined predictive capacitance for that net. Similarly, if wire length values are used, weights can be assigned to each net on the basis of the difference between the estimated wire length and the statistically determined maximum wire length of that net.

In practice, a cost function is used to reduce the number of circuit paths whose total estimated capacitance or wire length exceeds the total predicted capacitance or wire length. This can be done, for example, by assigning a cost value to each net prior to placing and routing the net. The assigned cost values can, for example, be directly related to the delay criticality of the path in which a net resides to the overall circuit layout. If a place-and-route system is unable to provide all nets with estimated capacitance (or wire length) values lower than the predictive values, increases in the estimated capacitances (or wire lengths) associated with nets having lower cost will be permitted in order to accommodate the higher cost nets.

Typically, a path through a circuit layout will be composed of a number of nets. If a given net in a given circuit layout path possesses an estimated capacitance (or wire length) which exceeds the predictive value by a negligible amount, the error may be balanced by other nets along the path having estimated capacitance (or wire length) values significantly less than the statistically determined predictive value. Thus, by assigning a weighted cost to each net, an acceptable total path signal delay can be obtained (block 620).

Preferably, an equal cost value is applied to all nets before a circuit layout is placed and routed. To begin placing and routing cells within a layout, the estimated capacitance (or wire length) values for an initial circuit layout is compared with the predictive capacitance or maximum wire length values for that net, thereby ensuring that the predictive capacitance or maximum wire length value is not exceeded. If the predictive value is exceeded, alternative placements (e.g., circuit net partitions) can be examined for that net, with the placement providing the smallest difference being chosen.

Following placement of an initial circuit layout net, each net is assigned a weight on the basis of its location. Then, the cost of each net is multiplied by its weight. The next circuit layout net is then placed and routed, and the weight assignment step is performed again. The steps of placing, comparing and assigning weights are repeated until all nets in the design have been placed and routed (blocks 500–530). Thus, the estimated capacitance (or wire length) of any placed net exceeds its predictive value by the minimum necessary for all circuit nets to be placed and routed in the circuit layout. The cost function will, therefore, minimize differences between estimated and predictive values throughout the circuit layout paths such that the minimum total cost for the entire circuit layout can be obtained.

At this juncture, it can be understood that the above-described techniques substantially reduce the number of nets whose actual capacitance would appear to the extreme right in a histogram such as shown in FIG. 1. Thus, the above-described techniques substantially increase the probability that total path delays comply with the performance expected from the predictive capacitances values.

Figure 2A:
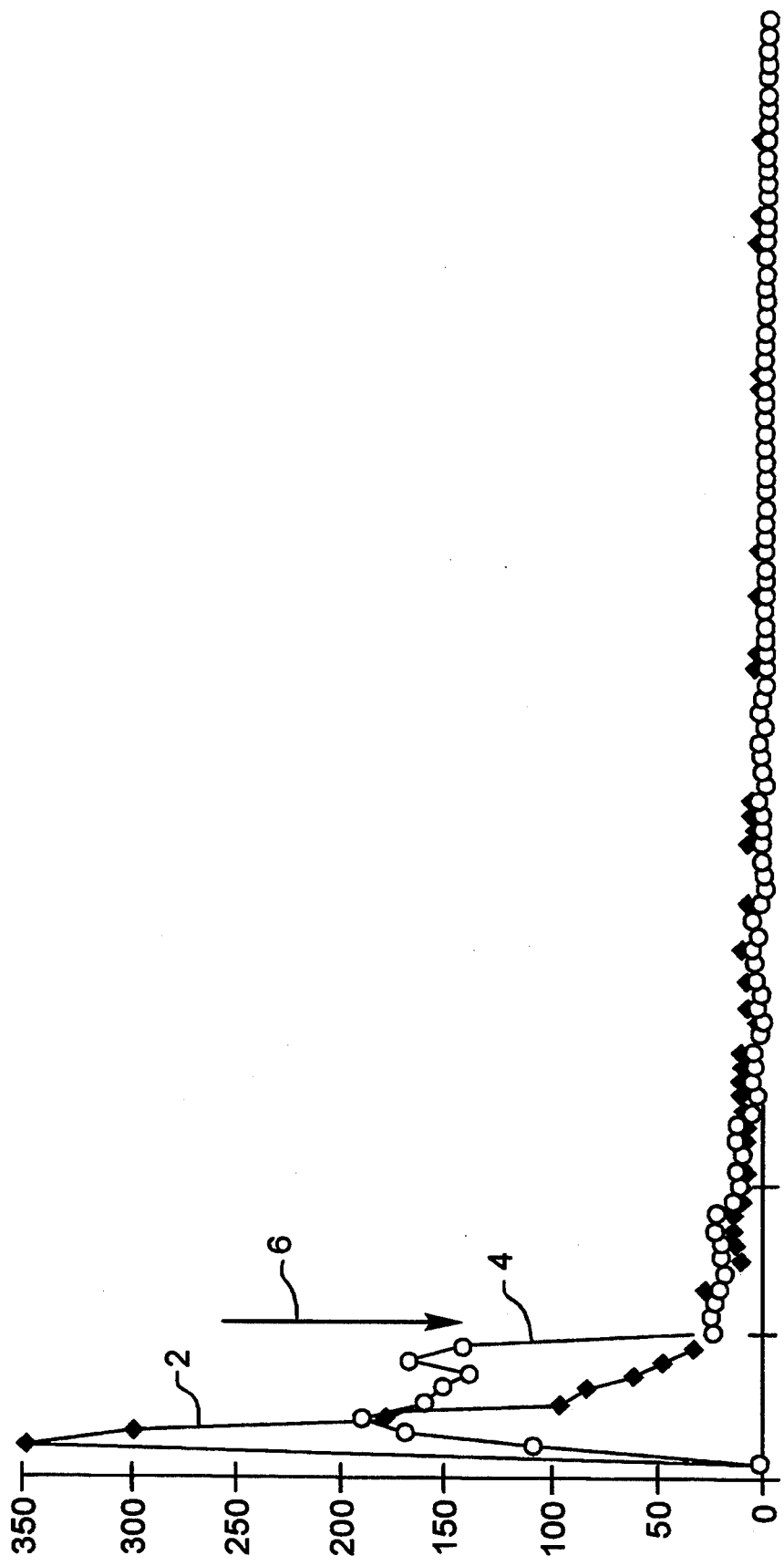
Figure 2B:
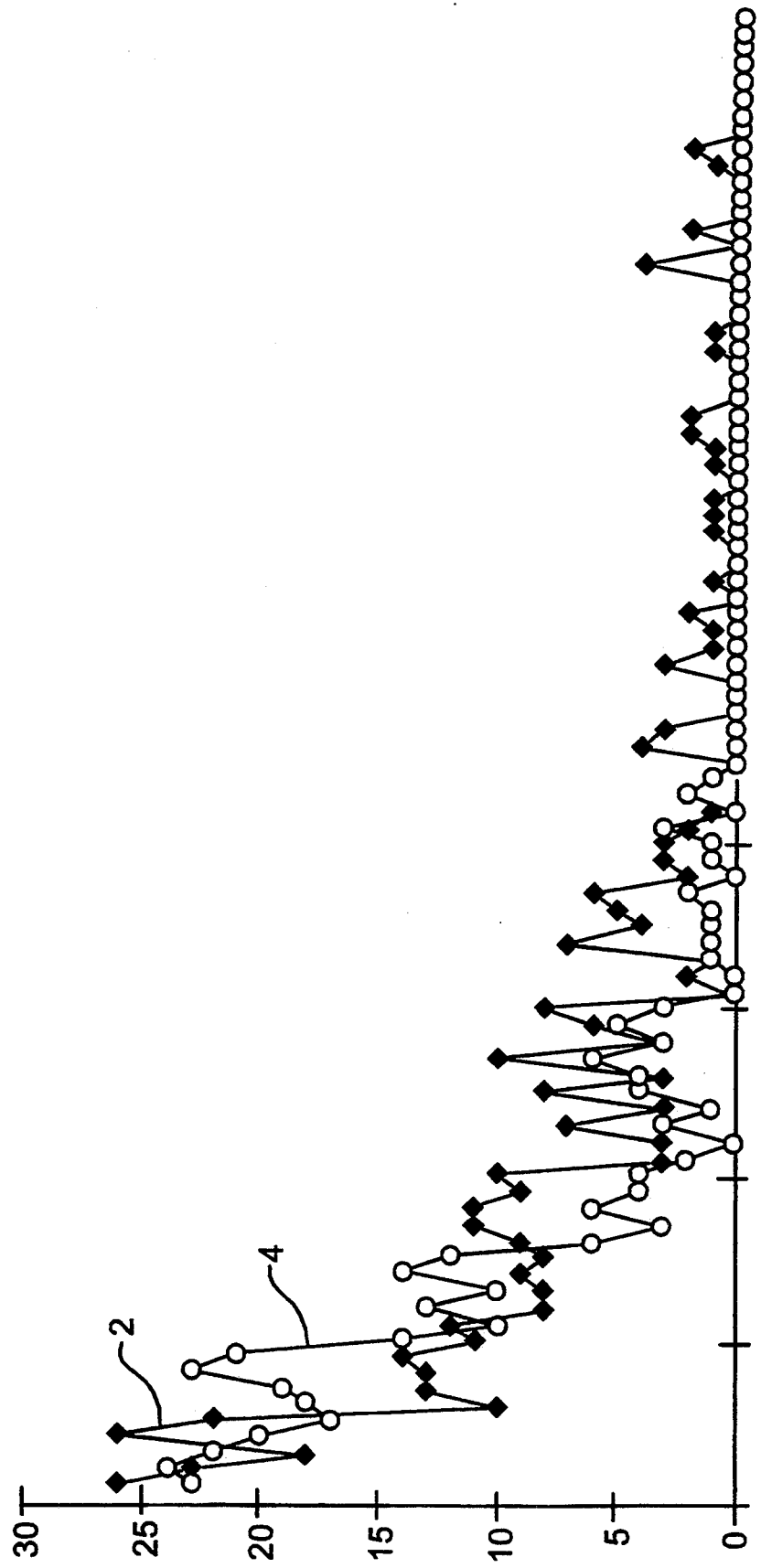

FIGS. 2A and 2B show a comparison of an initial capacitance distribution for a given circuit layout with a distribution after use of a predictive capacitance driven layout. In FIG. 2A, line 2 represents the original distribution of capacitances for a given circuit layout, and line 4 represents the distribution resulting from use of the predictive capacitance driven layout.

In FIG. 2A, it is evident that the distribution of capacitances for nets having less than the predictive capacitance value, as represented by the arrow 6, has been flattened. FIG. 2B shows that the layout using the predictive capacitance method has reduced the number of nets having capacitances much larger than the predictive capacitance value indicated by the arrow 6. Thus, circuit layouts according to the above-described procedure are likely to have fewer nets having capacitances that substantially exceed the predictive capacitance values for that type of net. Further, circuit logic can be designed and simulated prior to layout with increased confidence that the logic will meet pre-layout predictive performance criteria. Thus, the above-described techniques significantly reduce the time and expense of laying out complex integrated circuits.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

For example, although particular reference has been made to a method of custom designing of application-specific integrated circuits using a gate array block compiler system, the present invention is not limited to the design of gate array circuits or standard cell circuits but, instead, is equally applicable to transistor-level simulations, where the driving device is a transistor or a collection of transistors, as well as to the circuit layout design of a printed circuit board. Further, the method is equally applicable to analog circuit layout simulation. In addition, although specific reference will be made in the following description to fanout one nets, it would be readily apparent to one skilled in the art that the present invention is equally applicable to the design of circuit layouts which include a variety of fanout nets having any number of outputs.

What is claimed is:

1. A method for designing circuit layouts, including simulating a circuit on a computer, comprising the steps of:
   supplying a predictive capacitance value to the computer for at least one net of a circuit layout by calculating an average capacitance per unit wire length for the circuit layout and converting, via the average capacitance per unit wire length, the predictive capacitance for the at least one net of the circuit layout into a maximum wire length value for use as the layout design constraint;
   using the estimated wire length value in the computer for predicting the performance of the circuit prior to the layout;
   placing and routing all nets of the circuit layout on the simulated circuit using the at least one predictive capacitance value as a layout design constraint during the placing and routing.

2. The method of claim 1, wherein the step of supplying includes the step of:
   statistically determining predictive capacitances for different types of circuit nets based on at least one prior circuit design.

3. The method of claim 1, wherein predictive capacitance values are supplied for all nets of the circuit layout, and all of the predictive capacitance values are used as layout design constraints.

4. The method of claim 3, wherein the step of supplying includes the step of statistically determining predictive capacitance values for different types of circuit nets based on at least one prior circuit design.

5. The method of claim 4, wherein the step of supplying further includes the step of:
   converting, via the average capacitance per unit wire length, the predictive capacitances for all nets of the circuit layout into maximum wire length values for use as the layout design constraints, respectively.

6. The method of claim 4, wherein the step of placing and routing further includes steps of:
   estimating a capacitance value for each net placed in the circuit layout;
   comparing the estimated capacitance for each net placed in the circuit layout with the statistically determined predictive capacitance for that net; and
   minimizing the number of nets whose estimated capacitance exceeds their respective statistically determined predictive capacitance.

7. The method of claim 6, wherein the step of minimizing uses a cost evaluation function.

8. The method of claim 6, wherein the step of minimizing includes the steps of:

assigning first weights to nets whose estimated capacitance exceeds their statistically determined predictive capacitance;

assigning second weights, lower than the first weights, to nets whose estimated capacitance is less than their statistically determined predictive capacitance; and, locating the nets in the circuit layout, with nets assigned the first weights receiving priority.

9. The method of claim 8, wherein the steps of comparing and minimizing are repeated until all nets have been placed and routed in the circuit layout, and a cost function value for the circuit layout is minimized.

10. The method according to claim 9, wherein the cost function value reflects the number of nets whose estimated capacitance exceeds their respective statistically determined predictive capacitance and the magnitude by which the statistically determined predictive capacitance has been exceeded.

11. The method according to claim 10, wherein the statistically determined predictive capacitances and the estimated capacitances are formed as statistically determined wire lengths and estimated wire lengths, respectively, the statistically determined wire lengths and the estimated wire lengths being used in place of the statistically determined predictive capacitances and the estimated capacitances during the steps of comparing and minimizing.

12. The method of claim 1, wherein the circuit layout is a standard cell integrated circuit.

13. The method of claim 1, wherein the circuit layout is a gate array integrated circuit.

14. A method for designing an integrated circuit layout, including simulating an integrated circuit on a computer, comprising the steps of:

statistically determining a predictive interconnect capacitance for different types of integrated circuit layout nets;

on the computer, calculating an average capacitance per unit wire length for the integrated circuit layout;

on the computer, converting the predictive interconnect capacitance for each different type of net into a maximum wire length value using the calculated average capacitance;

placing at least one net at a desired location in an integrated circuit layout design on the simulated integrated circuit, and estimating wire length of each net on the basis of the placement;

on the computer, comparing the estimated wire length of each net with the maximum wire length for that net;

on the computer, assigning first weights to nets whose estimated wire length value exceeds its maximum wire length value and assigning second weights, lower than the first weights, to nets whose estimated wire length value is less than its maximum wire length value; and, repeating the steps of placing, comparing and assigning until all nets have been placed in the integrated circuit layout design on the simulated integrated circuit.

15. A computer implemented method for designing an integrated circuit layout comprising the computer implemented steps of:

statistically determining a predictive interconnect capacitance for different types of integrated circuit layout nets;

calculating an average capacitance per unit wire length for the integrated circuit layout;

converting the predictive interconnect capacitance for each different type of net into a maximum wire length value using the calculated average capacitance;

placing at least one net at a desired location in an integrated circuit layout design, and estimating wire length of each net on the basis of the placement;

comparing the estimated wire length of each net with the maximum wire length for that net;

assigning first weights to nets whose estimated wire length value exceeds its maximum wire length value and assigning second weights, lower than the first weights, to nets whose estimated wire length value is less than its maximum wire length value; and, repeating the steps of placing, comparing and assigning until all nets have been placed in the integrated circuit layout design.

* * * * *